US009354753B2

(12) United States Patent
Hotelling

(10) Patent No.: US 9,354,753 B2
(45) Date of Patent: *May 31, 2016

(54) PET-BASED TOUCH PAD

(75) Inventor: Steve Porter Hotelling, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 1336 days.

This patent is subject to a terminal disclaimer.

(21) Appl. No.: 13/080,472

(22) Filed: Apr. 5, 2011

(65) Prior Publication Data

US 2011/0181550 A1 Jul. 28, 2011

Related U.S. Application Data

(63) Continuation of application No. 11/818,394, filed on Jun. 13, 2007, now Pat. No. 7,948,477.

(60) Provisional application No. 60/875,037, filed on Dec. 15, 2006.

(51) Int. Cl.
G09G 5/00 (2006.01)
*G06F 3/044* (2006.01)
*G06F 3/041* (2006.01)

(52) U.S. Cl.
CPC .............. *G06F 3/044* (2013.01); *G06F 3/0416* (2013.01); *G06F 2203/04107* (2013.01); *Y10T 29/49165* (2015.01)

(58) Field of Classification Search
CPC ....................................................... G06F 3/044
See application file for complete search history.

(56) References Cited

U.S. PATENT DOCUMENTS

| 4,066,852 | A | 1/1978 | Zenk |
| 4,066,853 | A | 1/1978 | Zenk |
| 4,066,854 | A | 1/1978 | Zenk |
| 4,625,075 | A | 11/1986 | Jaeger |
| 5,117,071 | A | 5/1992 | Greanias et al. |
| 5,483,261 | A | 1/1996 | Yasutake |

(Continued)

FOREIGN PATENT DOCUMENTS

| CN | 1333477 A | 1/2002 |
| CN | 1754141 A | 3/2006 |

(Continued)

OTHER PUBLICATIONS

International Search Report mailed Jun. 6, 2008, for PCT Application No. PCT/US07/25157, filed Dec. 7, 2007, two pages.

(Continued)

*Primary Examiner* — Jason Olson
(74) *Attorney, Agent, or Firm* — Morrison & Foerster LLP

(57) ABSTRACT

A space-efficient substantially transparent mutual capacitance touch sensor panel can be created by forming columns made of a substantially transparent conductive material on one side of a first substantially transparent substrate, forming rows made of the substantially transparent conductive material on one side of a second substantially transparent substrate, adhering the two substrates together with a substantially transparent adhesive, bringing column connections down to the second substrate using vias, and routing both the column and row connections to a single connection area on the second substrate. In addition, in some embodiments some of the row connections can be routed to a second connection area on the second substrate to minimize the size of the sensor panel.

6 Claims, 7 Drawing Sheets

(56) References Cited

U.S. PATENT DOCUMENTS

| | | | |
|---|---|---|---|
| 5,488,204 A | 1/1996 | Mead et al. | |
| 5,565,658 A | 10/1996 | Gerpheide et al. | |
| 5,825,352 A | 10/1998 | Bisset et al. | |
| 5,835,079 A | 11/1998 | Shieh | |
| 5,844,175 A | 12/1998 | Nakanishi et al. | |
| 5,880,411 A | 3/1999 | Gillespie et al. | |
| 6,087,599 A | 7/2000 | Knowles | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,549,195 B2 | 4/2003 | Hikida et al. | |
| 6,583,935 B1 | 6/2003 | Saif et al. | |
| 6,680,448 B2 | 1/2004 | Kawashima et al. | |
| 6,690,387 B2 | 2/2004 | Zimmerman et al. | |
| 6,784,948 B2 | 8/2004 | Kawashima et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 7,948,477 B2 | 5/2011 | Hotelling | |
| 8,479,122 B2 | 7/2013 | Hotelling et al. | |
| 2001/0000961 A1 | 5/2001 | Hikida et al. | |
| 2002/0000979 A1 | 1/2002 | Furuhashi et al. | |
| 2002/0097228 A1 | 7/2002 | Park et al. | |
| 2003/0052867 A1* | 3/2003 | Shigetaka et al. | 345/173 |
| 2003/0213624 A1 | 11/2003 | Cross et al. | |
| 2004/0119701 A1 | 6/2004 | Mulligan et al. | |
| 2005/0083307 A1* | 4/2005 | Aufderheide et al. | 345/173 |
| 2005/0110769 A1 | 5/2005 | DaCosta et al. | |
| 2005/0156906 A1 | 7/2005 | Chiu et al. | |
| 2006/0026521 A1 | 2/2006 | Hotelling et al. | |
| 2006/0097991 A1 | 5/2006 | Hotelling et al. | |
| 2006/0197753 A1 | 9/2006 | Hotelling | |
| 2008/0143683 A1 | 6/2008 | Hotelling | |

FOREIGN PATENT DOCUMENTS

| | | |
|---|---|---|
| CN | 1906658 A | 1/2007 |
| EP | 0 483 519 A1 | 5/1992 |
| EP | 0 483 519 B1 | 5/1992 |
| JP | 2000-163031 A | 6/2000 |
| JP | 2002-342033 A | 11/2002 |
| WO | WO-2008/076237 A2 | 6/2008 |
| WO | WO-2008/076237 A3 | 6/2008 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action mailed May 27, 2010, for U.S. Appl. No. 11/818,394, 18 pages.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

PET-BASED TOUCH PAD

CROSS-REFERENCE TO RELATED APPLICATIONS

This application is a continuation of U.S. patent application Ser. No. 11/818,394, filed Jun. 13, 2007, which claims the benefit under 35 USC 119(e) of U.S. provisional patent application Ser. No. 60/875,037 filed Dec. 15, 2006, the contents of which are incorporated by reference herein.

FIELD OF THE INVENTION

This invention relates to touch sensor panels, and more particularly, to substantially transparent mutual capacitance touch sensor panels having rows and columns formed on separate plastic substrates.

BACKGROUND OF THE INVENTION

Many types of input devices are presently available for performing operations in a computing system, such as buttons or keys, mice, trackballs, touch panels, joysticks, touch screens and the like. Touch screens, in particular, are becoming increasingly popular because of their ease and versatility of operation as well as their declining price. Touch screens can include a touch panel, which can be a clear panel with a touch-sensitive surface. The touch panel can be positioned in front of a display screen so that the touch-sensitive surface covers the viewable area of the display screen. Touch screens can allow a user to make selections and move a cursor by simply touching the display screen via a finger or stylus. In general, the touch screen can recognize the touch and position of the touch on the display screen, and the computing system can interpret the touch and thereafter perform an action based on the touch event.

Touch panels can include an array of touch sensors capable of detecting touch events (the touching of fingers or other objects upon a touch-sensitive surface). Some panels can detect multiple touches (the touching of fingers or other objects upon a touch-sensitive surface at distinct locations at about the same time) and near touches (fingers or other objects within the near-field detection capabilities of their touch sensors), and identify and track their locations. Examples of multi-touch panels are described in Applicant's co-pending U.S. application Ser. No. 10/842,862 entitled "Multipoint Touchscreen," filed on May 6, 2004 and published as U.S. Published Application No. 2006/0097991 on May 11, 2006, the contents of which are incorporated by reference herein.

Sensor panels with substrates made of plastics such as polyethylene terephthalate (PET) can be less expensive and can be made thinner than sensor panels with substrates made of glass, but can have their own design challenges. For example, because it can be more difficult to form thin metal traces on plastic substrates, sensor panels formed with metal traces on the borders can force the sensor panel to be widened.

SUMMARY OF THE INVENTION

A space-efficient mutual capacitance touch sensor panel can be created by forming columns on one side of a first plastic substrate, forming rows on one side of a second plastic substrate, adhering the two substrates together, bringing column connections down to the second substrate using vias, and routing both the column and row connections to a single connection area on the second substrate. In addition, in some embodiments some of the row connections can be routed to a second connection area on the second substrate to minimize the size of the sensor panel.

A mutual capacitance touch sensor panel can include, from top to bottom, a top layer of optically clear release liner, optically clear pressure sensitive adhesive (PSA), a top polyethylene terephthalate (PET) layer upon which transparent column traces of Indium Tim Oxide (ITO) have been etched, another layer of PSA, and a bottom PET layer upon which wide row traces of ITO have been etched. The PET layers along with the PSA can act as a dielectric between the row and column traces.

To establish off-panel connections with the columns, vias can be formed in the top PET layer, the second PSA layer, and the bottom PET layer, and can be filled or coated with a conductive material such as silver paste to make electrical connections between layers. In particular, the vias can connect to the column traces on the top PET layer and metal traces on the PET layer that are routed to a first tail.

To establish off-panel connections with the rows, metal traces can be connected to the rows and routed along the borders of the bottom PET layer to the first tail. In some embodiments, traces can also be connected to rows and routed along the borders of the PET layer to a second tail. To prevent shorts or damage to traces, especially where those traces make right-angled bends, PET coverlay can be applied to the bottom PET layer prior to lamination with the other layers in the stack.

The tails can be integrally formed with the PET layer, and can be directly inserted into connectors such as zero insertion force (ZIF) connectors on a system board, or in other embodiments flex connectors such as flexible printed circuits (FPCs) can be conductively bonded to the tails. The mutual capacitance design of the sensor panel can enable the use of a second tail or flex circuits to connect to remote components, because the parasitic capacitance inherent in long connectors does not have a direct effect on the sensed signaling appearing on the column traces leaving the sensor panel. In contrast, self-capacitance sensor panels can be very susceptible to parasitic capacitance, and thus usually require very short connectors. Thus, in general, mutual capacitance touch sensor panels can allow more flexibility in product design, and can allow the sensor panel to be remotely located from other system components.

DETAILED DESCRIPTION OF THE PREFERRED EMBODIMENT

Figure 1:
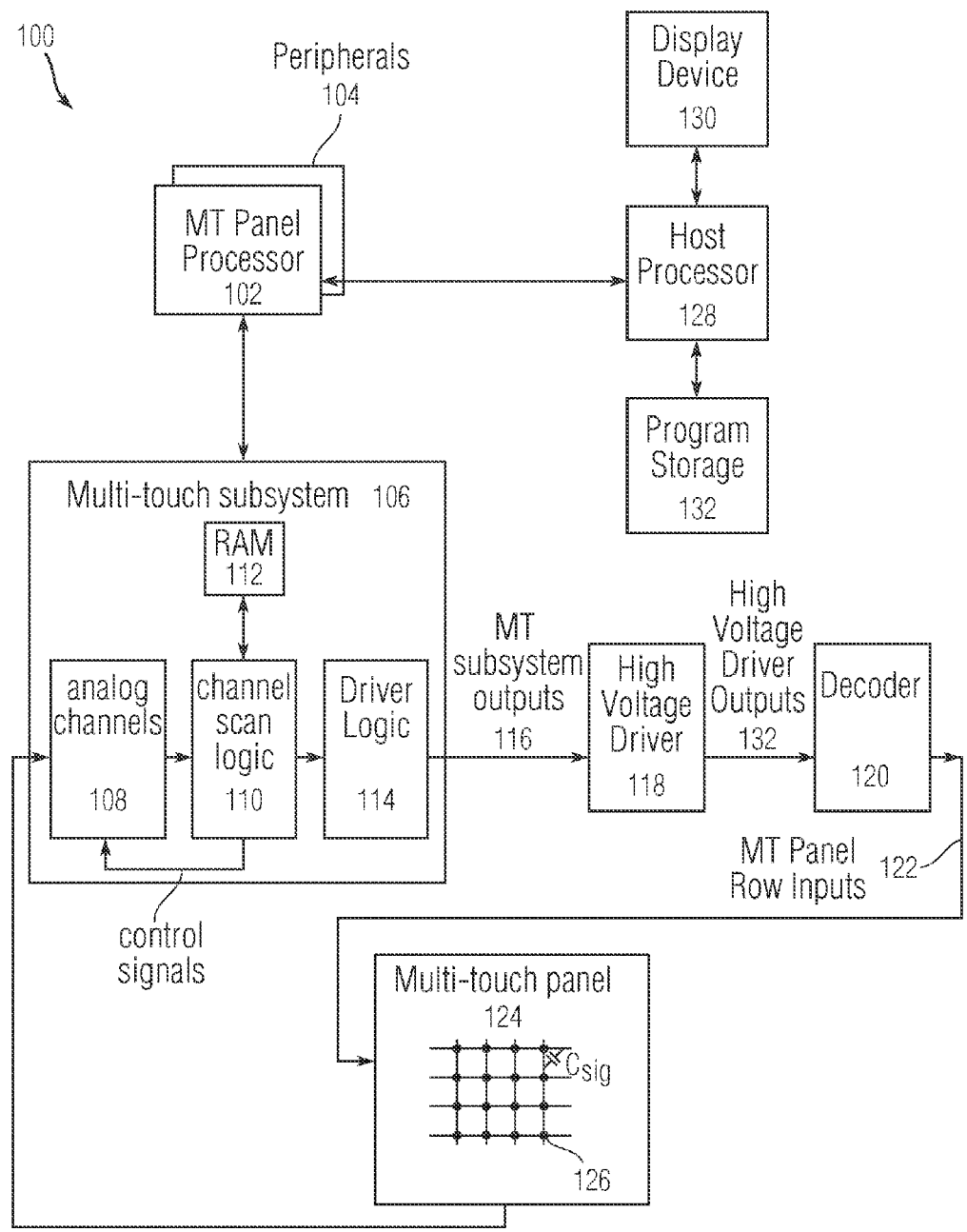
FIG. 1 illustrates exemplary computing system operable with space-efficient mutual capacitance touch sensor panel according to one embodiment of this invention.

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

A substantially transparent sensor panel can be formed using plastic substrates to take advantage of the cost-effectiveness and manufacturing ease of plastic. Although some capacitive sensor panels can employ rows and columns formed on opposite sides of the same substrate, this approach can be difficult when using plastic substrates. Therefore, in embodiments of the invention, rows and columns can be formed on separate first and second substrates formed from a plastic such as PET.

In particular, a space-efficient substantially transparent mutual capacitance touch sensor panel can be created by forming conductive and substantially transparent columns on one side of a first substantially transparent plastic substrate, forming conductive and substantially transparent rows on one side of a second substantially transparent plastic substrate, and adhering the two substrates together with a substantially transparent adhesive, in some embodiments sandwiching a third substantially transparent plastic substrate between the first and second substantially transparent plastic substrates. Any one or more of the substantially transparent plastic substrates that can be sandwiched between the rows and columns can act as the dielectric material separating the rows and columns, thereby creating a mutual capacitance between sensor electrodes. Column connections can be routed down to the second substrate using vias, and both the column and row connections can be routed to a single connection area on the second substrate. Metal traces along the borders of the sensor panel can be used to route either the row or column traces to a particular edge of the sensor panel. In some embodiments, the substantially transparent substrates can be formed from PET, and the substantially transparent rows and columns can be formed from ITO.

In some embodiments, the sensor panel can be self-shielding if the row traces are made wide to shield the column traces from noise from an adjacent liquid crystal display (LCD). Self-shielding sensor panels can require a certain thickness between the rows and columns so that the static capacitance is not too large as compared to the mutual capacitance that can be affected by a finger or other object. However, because the dielectric constant of plastic can be about half that of glass, the thickness of the one or more substrates between the rows and columns can be about half that of glass, resulting in a thinner sensor panel as compared to sensor panels with substrates made of glass.

As noted above, high density metal traces are generally not available in plastic technology. In other words, metal traces cannot be reliably formed in thin line widths on plastic, and 200-300 micron line widths are generally necessary. With such line widths, sensor panel dimensions would have to grow to accommodate the routing of numerous 200-300 micron metal traces along the borders to a flexible printed circuit (FPC) (a first tail) on a single edge of the sensor panel. As a countermeasure, to keep the borders and the overall panel width from getting too wide, approximately half the traces can be routed to the opposite edge of the panel to a secondary FPC (a secondary tail).

FIG. 1 illustrates exemplary computing system 100 operable with space-efficient mutual capacitance touch sensor panel 124 according to embodiments of this invention. Sensor panel 124 can be connected to other components in computing system 100 through connectors integrally formed on the sensor panel, or using flex circuits. Computing system 100 can include one or more panel processors 102, peripherals 104, and panel subsystem 106. The one or more processors 102 can include, for example, ARM968 processors or other processors with similar functionality and capabilities. However, in other embodiments, the panel processor functionality can be implemented instead by dedicated logic such as a state machine. Peripherals 104 can include, but are not limited to, random access memory (RAM) or other types of memory or storage, watchdog timers and the like.

Panel subsystem 106 can include, but is not limited to, one or more analog channels 108, channel scan logic 110 and driver logic 114. Channel scan logic 110 can access RAM 112, autonomously read data from the analog channels and provide control for the analog channels. This control can include multiplexing columns of multi-touch panel 124 to analog channels 108. In addition, channel scan logic 110 can control the driver logic and stimulation signals being selectively applied to rows of multi-touch panel 124. In some embodiments, panel subsystem 106, panel processor 102 and peripherals 104 can be integrated into a single application specific integrated circuit (ASIC).

Driver logic 114 can provide multiple panel subsystem outputs 116 and can present a proprietary interface that drives high voltage driver 118. High voltage driver 118 can provide level shifting from a low voltage level (e.g. complementary metal oxide semiconductor (CMOS) levels) to a higher voltage level, providing a better signal-to-noise (S/N) ratio for noise reduction purposes. The high voltage driver outputs can be sent to decoder 120, which can selectively connect one or more high voltage driver outputs to one or more panel row inputs 122 through a proprietary interface and enable the use of fewer high voltage driver circuits in the high voltage driver 118. Each panel row input 122 can drive one or more rows in a multi-touch panel 124. In some embodiments, high voltage driver 118 and decoder 120 can be integrated into a single ASIC. However, in other embodiments high voltage driver 118 and decoder 120 can be integrated into driver logic 114, and in still other embodiments high voltage driver 118 and decoder 120 can be eliminated entirely.

Computing system 100 can also include host processor 128 for receiving outputs from panel processor 102 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 128 can also perform additional functions that may not be related to panel processing, and can be coupled to program storage 132 and display device 130 such as a liquid crystal display (LCD) for providing a UI to a user of the device.

As mentioned above, multi-touch panel 124 can in some embodiments include a capacitive sensing medium having a plurality of row traces or driving lines and a plurality of column traces or sensing lines separated by a dielectric. In some embodiments, the dielectric material can be transparent, such as polyethylene terephthalate (PET) or glass. The row and column traces can be formed from a transparent conductive medium such as indium tin oxide (ITO) or antimony tin oxide (ATO), although other non-transparent materials such as copper can also be used. In some embodiments, the row and column traces can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as may be used herein are intended to encompass not only orthogonal grids, but the intersecting traces of other geometric configurations having first and second dimensions (e.g. the concentric and radial lines of a polar-coordinate arrangement).

At the "intersections" of the traces, where the traces pass above and below each other (but do not make direct electrical contact with each other), the traces essentially form two electrodes. Each intersection of row and column traces can represent a capacitive sensing node and can be viewed as picture element (pixel) 126, which can be particularly useful when multi-touch panel 124 is viewed as capturing an "image" of touch. (In other words, after panel subsystem 106 has determined whether a touch event has been detected at each touch sensor in multi-touch panel 124, the pattern of touch sensors in the multi-touch panel at which a touch event occurred can be viewed as an "image" of touch (e.g. a pattern of fingers touching the panel).) When the two electrodes are at different potentials, each pixel can have an inherent self or mutual capacitance formed between the row and column electrodes of the pixel. If an AC signal is applied to one of the electrodes, such as by exciting the row electrode with an AC voltage at a particular frequency, an electric field and an AC or signal capacitance can be formed between the electrodes, referred to as Csig. The presence of a finger or other object near or on multi-touch panel 124 can be detected by measuring changes to Csig. The columns of multi-touch panel 124 can drive one or more analog channels 108 in panel subsystem 106. In some embodiments, each column is coupled to one dedicated analog channel 108. However, in other embodiments, the columns can be couplable via an analog switch to a fewer number of analog channels 108.

As described above, because the rows can either be stimulated with an AC signal or held at a DC voltage level, and because the columns need to be connected to analog channels so that modulated output signals can be detected, demodulated and converted to output values, electrical connections must be formed with the rows and columns on either side of the dielectric of the sensor panel.

Figure 2A:
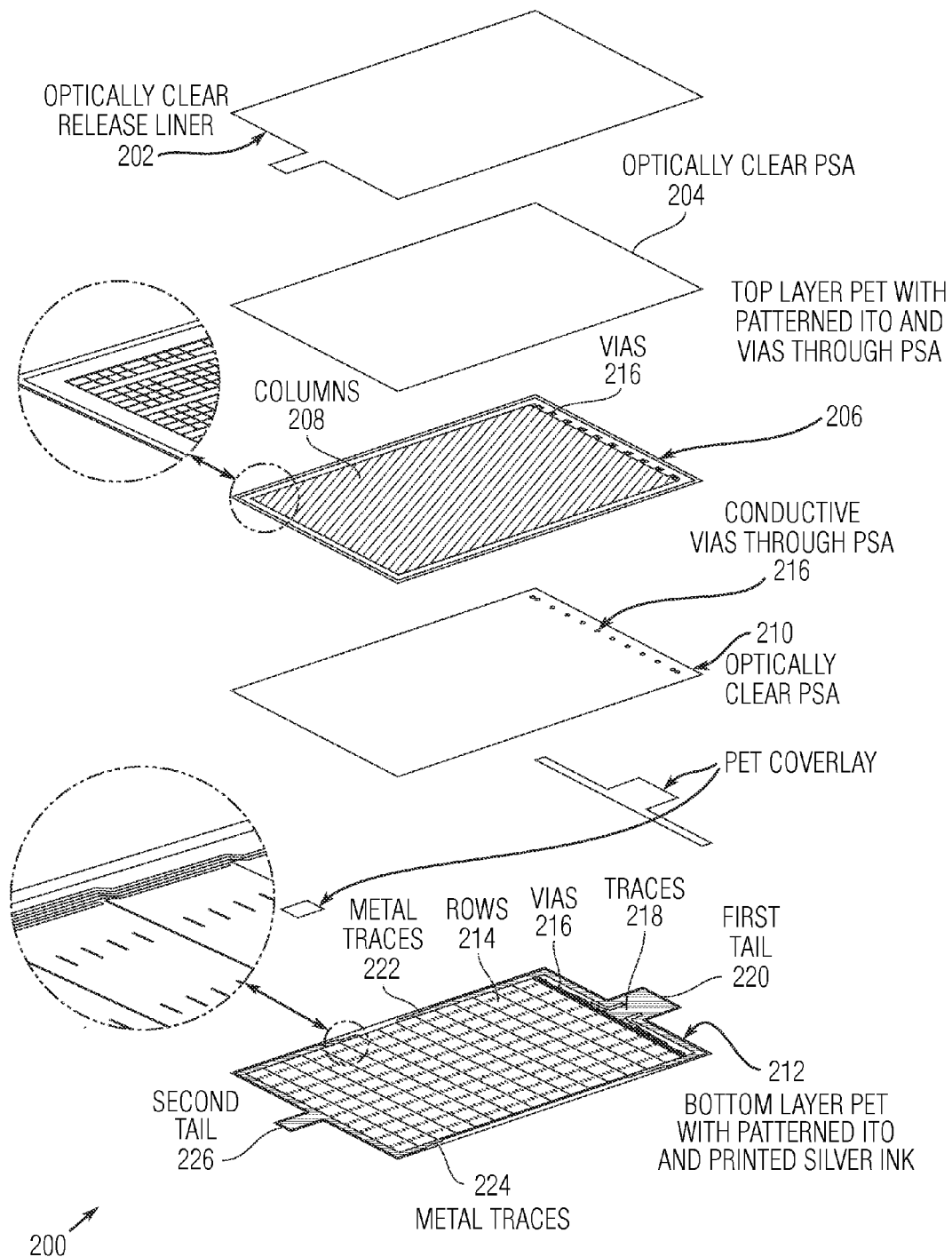
FIG. 2a is an exploded perspective view of the layers of an exemplary mutual capacitance touch sensor panel according to one embodiment of this invention.

FIG. 2a is an exploded perspective view of the layers of an exemplary mutual capacitance touch sensor panel 200 according to embodiments of this invention. Sensor panel 200 can be assembled using a top layer of optically clear release liner 202, optically clear pressure sensitive adhesive (PSA) 204, top PET layer 206 upon which transparent column traces of ITO 208 have been etched, another layer of PSA 210, and bottom PET layer 212 upon which wide row traces of ITO 214 have been etched. PET layers 206 and 212 along with PSA 210 can act as a dielectric between the row and column traces. It should be understood that the materials in FIG. 2 are only exemplary—for example, row and column traces 208 and 214 can be made of material other than ITO, including, but not limited to ATO and copper, and layers 206 and 212 can be made of materials other that PET, including, but not limited to glass and polycarbonate.

To establish off-panel connections with columns 208, vias 216 can be formed in layers 206, 210 and 212 and filled or coated with a conductive material such as silver paste to make electrical connections between layers 206 and 212. Vias 216 can be formed on PET layer 206, PSA 210, and PET layer 212 prior to lamination or after lamination. Vias 216 connect to column traces 208 on PET layer 206 and connect to traces 218 on PET layer 212 that are routed to first tail 220.

To establish off-panel connections with rows 214, traces 222 can be connected to the rows and routed along the borders of PET layer 212 to first tail 220 (where the border is defined as the area between the start of the opaque portion of the PET layer and the edge of the PET layer). Note that rows 214 can carry driving signals and are therefore less susceptible to capacitive and inductive effects than columns 208, which carry sensed signals, and thus rows 214 can be chosen as the traces to be extended and routed along the borders of PET layer 212. In some embodiments, traces 224 can also be connected to rows 214 and routed along the borders of PET layer 212 to second tail 226. Traces 218, 222 and 226 can be formed from a metal such as silver ink. To prevent shorts or damage to traces 218, 222 and 226, especially where those traces make right-angled bends, PET coverlay 228 can be applied to PET layer 211 prior to lamination with the other layers in the stack.

Tails 220 and 226 can be integrally formed with PET layer 212, and can be directly inserted into connectors such as zero insertion force (ZIF) connectors on a system board, or in other embodiments flex connectors can be conductively bonded to the tails. It should be understood that the mutual capacitance design of sensor panel 200 enables the use of a second tail or flex circuits to connect to remote components, because the parasitic capacitance inherent in long connectors does not have a direct effect on the sensed signaling appearing on the column traces leaving the sensor panel. However, self-capacitance sensor panels are very susceptible to parasitic capacitance, and thus usually require very short connectors. Thus, in general, mutual capacitance touch sensor panel designs allow much more flexibility in product design, and allow the sensor panel to be remotely located from other system components.

Figure 2B:
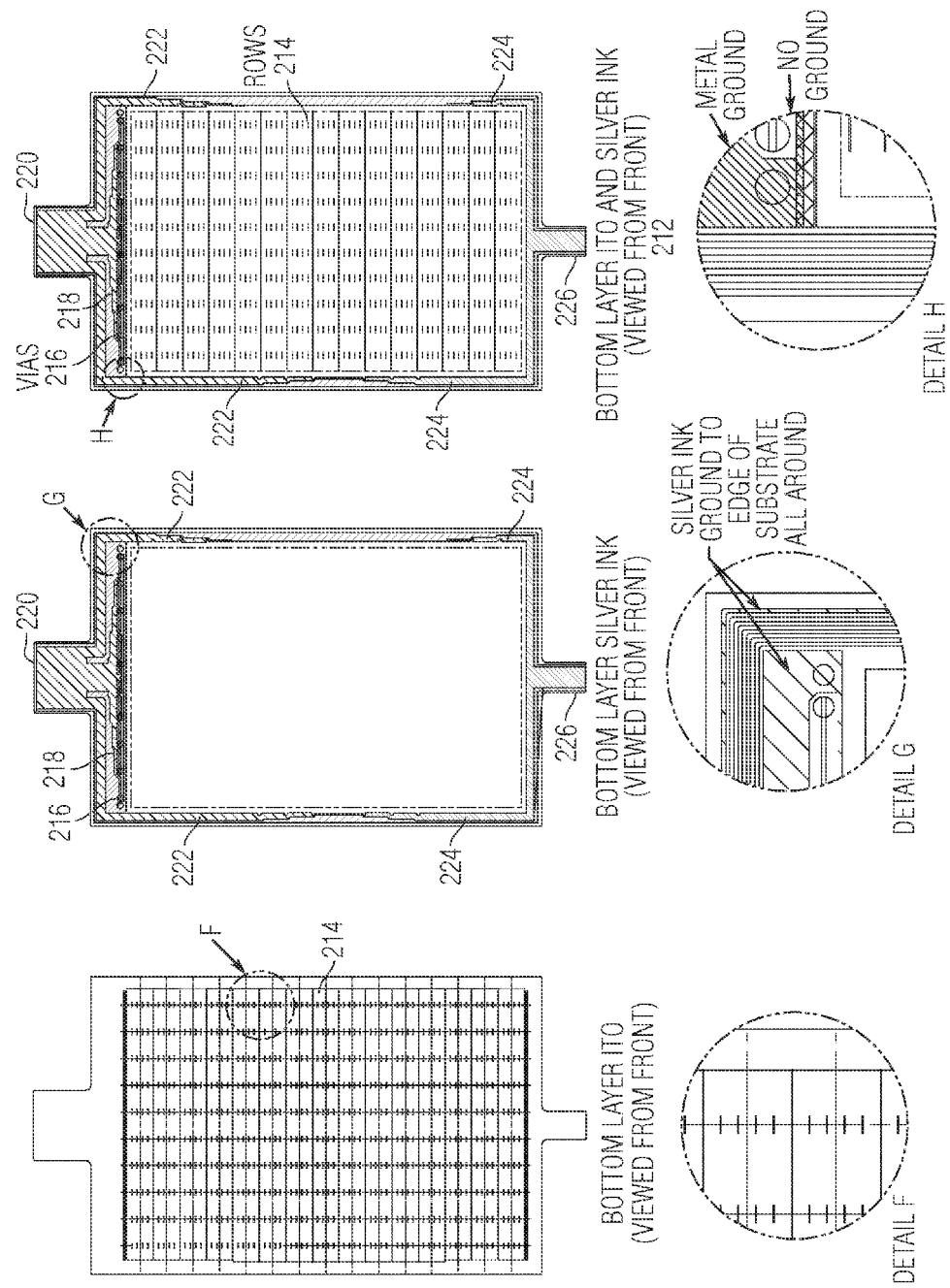
FIG. 2b illustrates an outer side view of exemplary bottom PET layer according to one embodiment of this invention.

FIG. 2b illustrates an outer side view of exemplary bottom PET layer 212 according to embodiments of this invention. From left to right, FIG. 2b shows the patterned ITO layer, the metal layer, and PET layer 212 with both the ITO and metal layers superimposed. FIG. 2b shows rows 214, vias 216, traces 218, first tail 220, traces 222, traces 224, and second tail 226. As FIG. 2b suggests, connection all row traces 214 to first tail 220 would require a larger width PET layer 212 due to the need to route more traces 222 in parallel along the borders of the PET layer. In addition, a wider area is needed because traces generally need to be wider when printed on PET as opposed to other substrates such as glass. Therefore, in some embodiments of this invention illustrated in the example of FIG. 2b, row traces 214 further away from first tail 220 can be routed in the opposite direction from first tail 220 to second tail 226 on the opposite edge of PET layer 212. By routing some of the traces to second tail 226 through traces 224, the width required by the traces running at the borders of PET layer 212 is reduced, which can allow for reduced product dimensions.

Figure 2C:
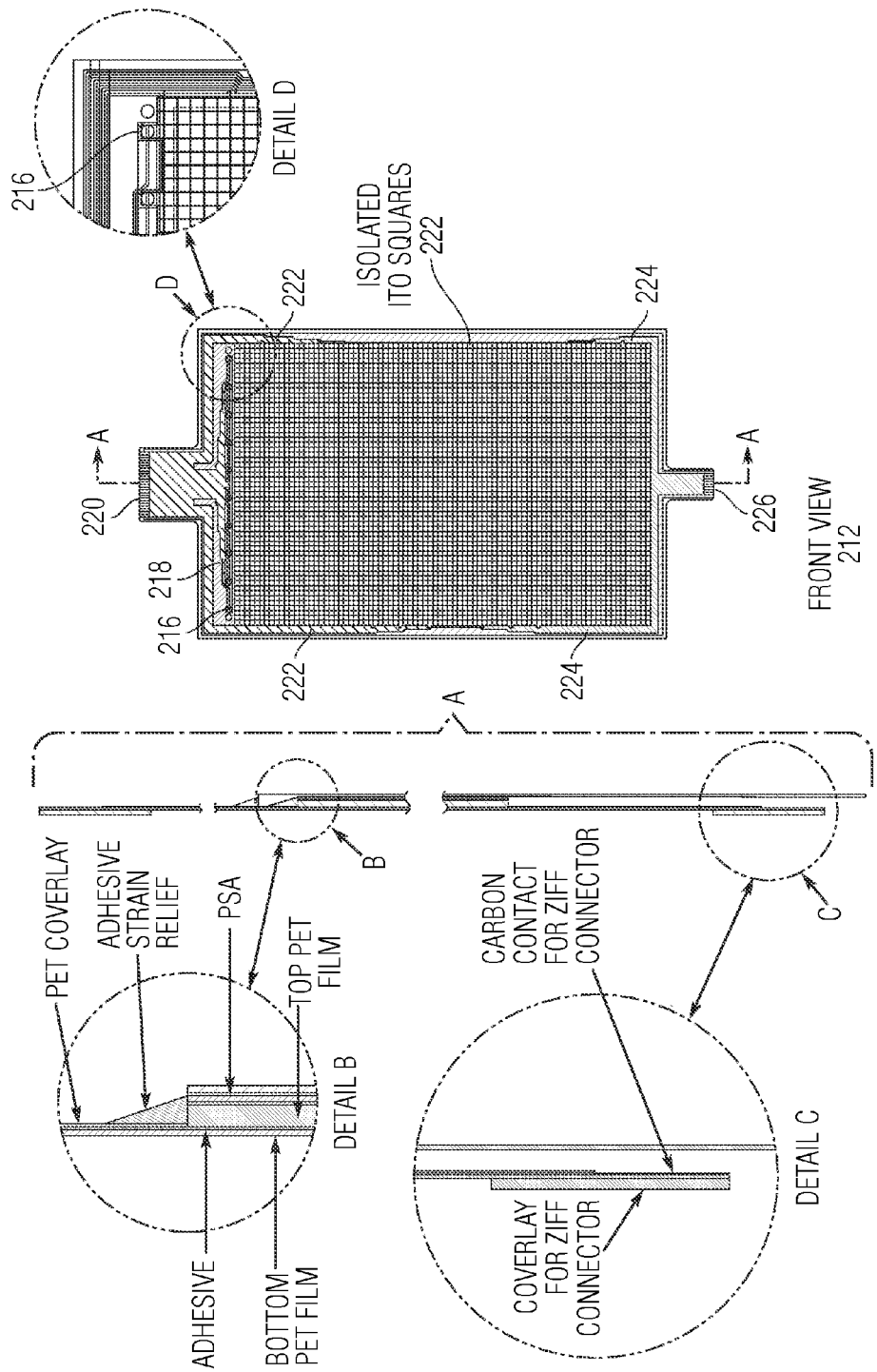
FIG. 2c illustrates an outer side view of the entire assembly according to one embodiment of this invention.

FIG. 2c illustrates an outer side view of the entire assembly according to embodiments of this invention. FIG. 2c shows isolated ITO squares 228 created to provide a uniform appearance.

Figure 2D:
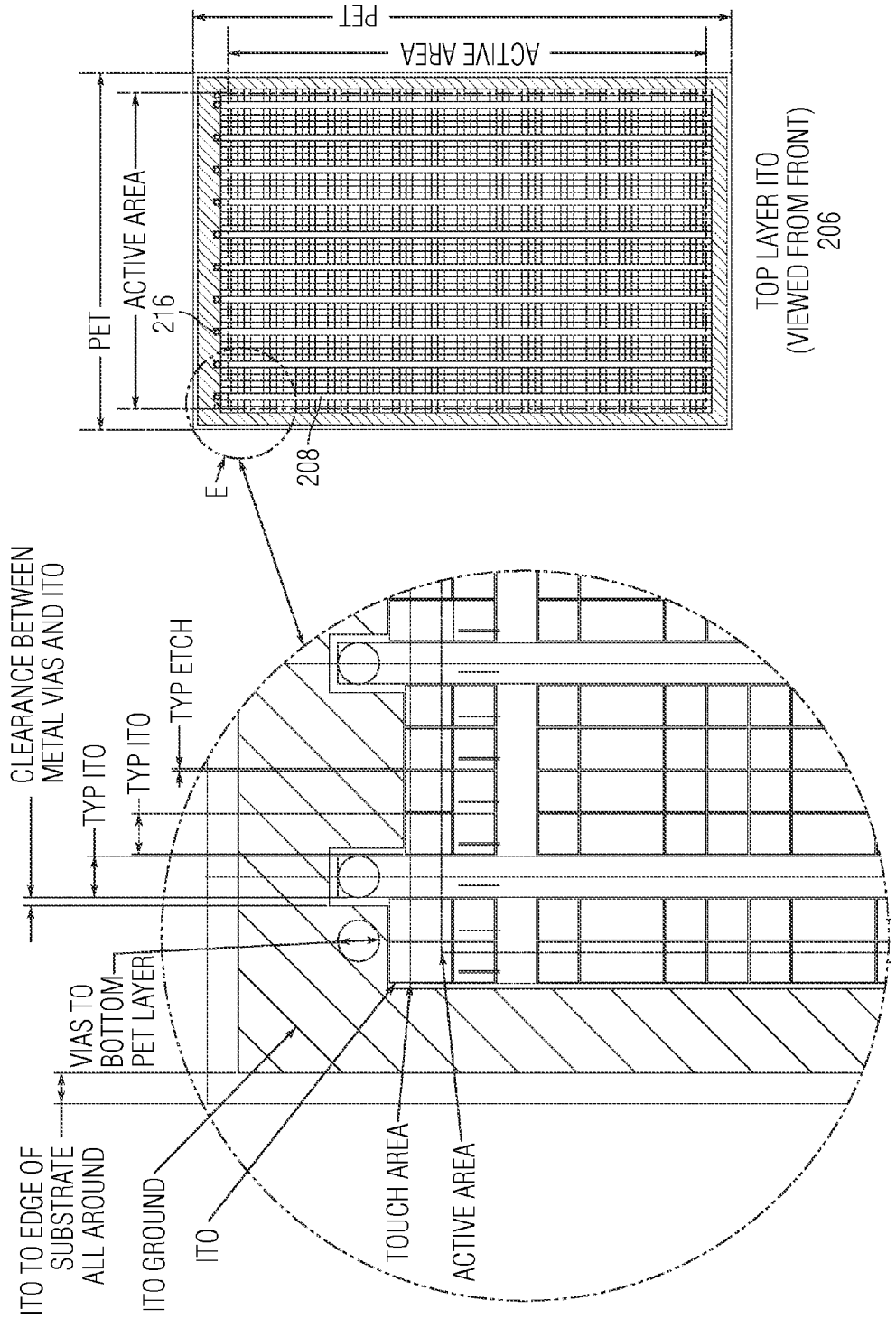
FIG. 2d illustrates an exemplary top PET layer according to one embodiment of this invention.

FIG. 2d illustrates an exemplary top PET layer 206 according to embodiments of this invention. FIG. 2d shows columns 208 connected directly to vias 216.

Figure 2E:
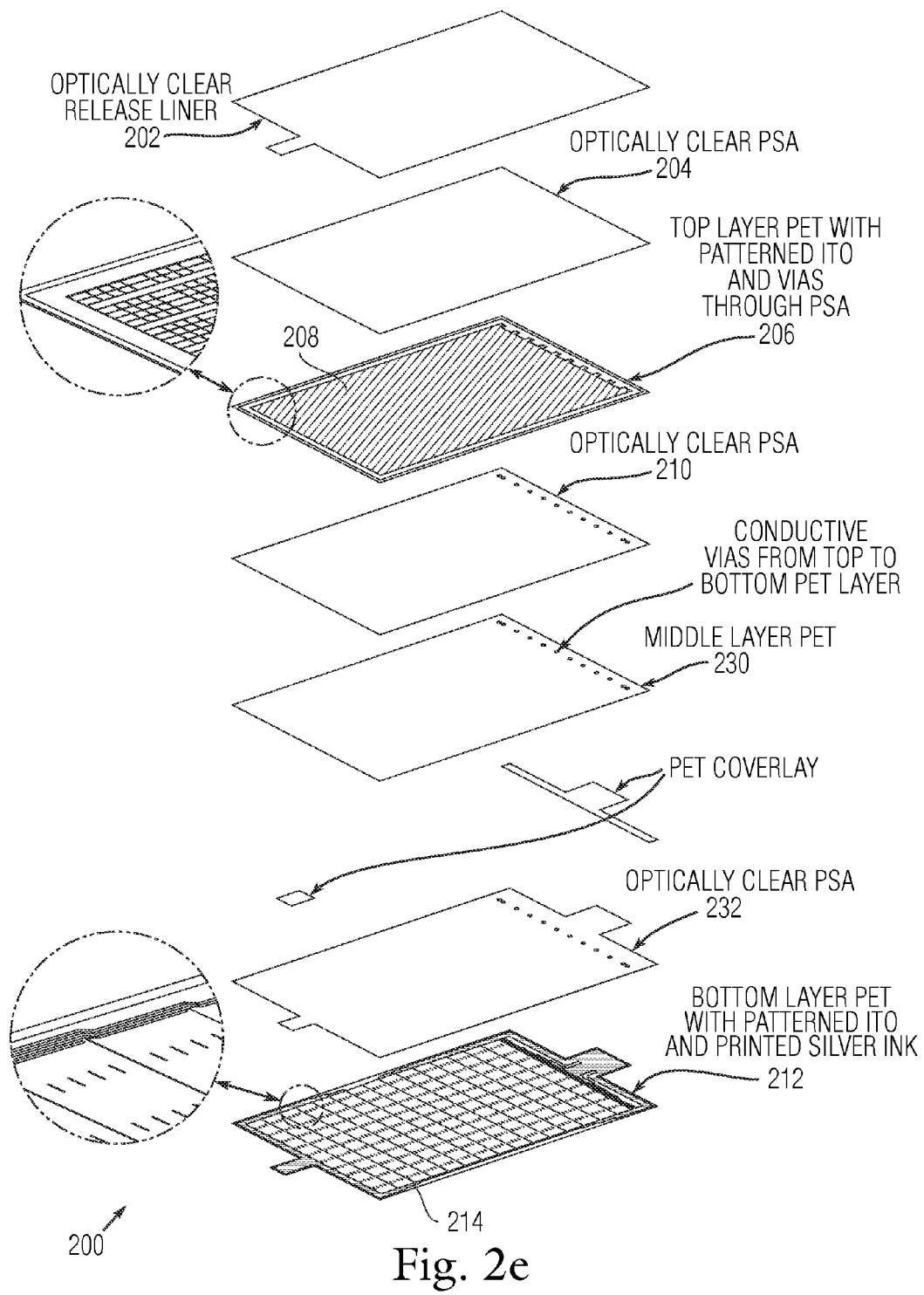
FIG. 2e is an exploded perspective view of the layers of another exemplary mutual capacitance touch sensor panel according to one embodiment of this invention.

FIG. 2e is an exploded perspective view of the layers of another exemplary mutual capacitance touch sensor panel 200 according to embodiments of this invention. Sensor panel 200 can be assembled using a top layer of optically clear release liner 202, optically clear pressure sensitive adhesive (PSA) 204, top PET layer 206 upon which transparent column traces of ITO 208 have been etched, another layer of PSA 210, middle PET layer 230, yet another layer of PSA 232, and bottom PET layer 212 upon which wide row traces of ITO 214 have been etched. Middle PET layer 230 along with PSA 210 and 232 can act as a dielectric between the row and column traces. It should be understood that the materials in FIG. 2 are only exemplary—for example, row and column traces 208 and 214 can be made of material other than ITO, including, but not limited to ATO and copper, and layers 206 and 212 can be made of materials other that PET, including, but not limited to glass and polycarbonate.

Figure 3A:
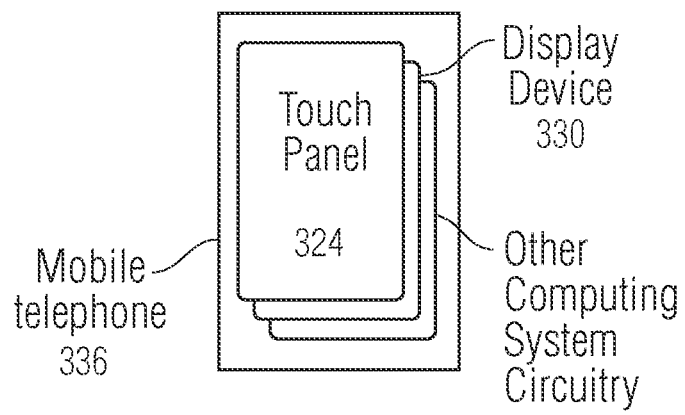
FIG. 3a illustrates an exemplary mobile telephone that can include the computing system of FIG. 1 and a substantially transparent mutual capacitive touch sensor panel according to one embodiment of this invention.
Figure 3B:
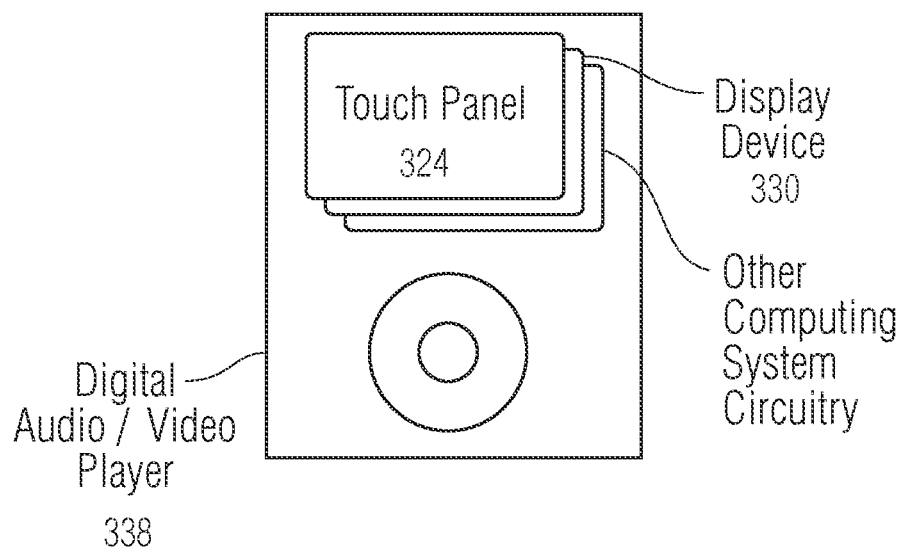
FIG. 3b illustrates an exemplary digital audio player that can include the computing system of FIG. 1 and a substantially transparent mutual capacitive touch sensor panel according to one embodiment of this invention.

FIGS. 3a and 3b illustrate an exemplary mobile telephone 336 and an exemplary digital audio player 338 that can include the computing system of FIG. 1 and a substantially transparent mutual capacitive touch sensor panel 324 according to embodiments of this invention. The mobile telephone and digital audio player of FIGS. 3a and 3b can advantageously benefit from the substantially transparent mutual capacitive sensor panel of embodiments of the invention because such a sensor panel can be used to form a touch screen with a display behind the sensor panel, and can be made thinner and narrower.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A substantially transparent mutual capacitance touch sensor panel, comprising:
   a first substantially transparent substrate;
   a second substantially transparent substrate;
   a first plurality of electrodes of a first substantially transparent conductive material formed on the first substantially transparent substrate;
   a second plurality of electrodes of the first substantially transparent conductive material formed on the second substantially transparent substrate;
   a first group of traces of a second conductive material formed on the second substantially transparent substrate and routed along a first border of the second substantially transparent substrate for connecting to a first group of the second plurality of electrodes and routing the first group of the second plurality of the electrodes for providing off-panel connections at a first edge of the second substrate;
   a second group of traces of the second conductive material formed on the second substantially transparent substrate and routed along the first border of the second substantially transparent substrate for connecting to a second group of the second plurality of electrodes and routing the second group of the second plurality of the electrodes for providing off-panel connections at a second edge of the second substrate, different from the first edge; and
   wherein one or more mutual capacitance sensors are formed between the first and second plurality of electrodes at locations at which the first and second plurality of electrodes cross over each other, a mutual capacitance of each mutual capacitance sensor capable of being modified by an object in close proximity to the sensor.

2. The touch sensor panel of claim 1 further comprising means for connecting the first plurality of electrodes on the first substantially transparent substrate to the second substantially transparent substrate.

3. The touch sensor panel of claim 1 further comprising:
   a second group of traces of the second conductive material formed on the second substantially transparent substrate and routed along a second border of the second substantially transparent substrate, opposite the first border, for connecting to a third group of the second plurality of electrodes and routing the third group of the second plurality of the electrodes to the first edge of the second substrate for providing off-panel connections;
   a fourth group of traces of the second conductive material formed on the second substantially transparent substrate and routed along the second border of the second substantially transparent substrate for connecting to a fourth group of the second plurality of electrodes and routing the fourth group of the second plurality of the electrodes to the second edge of the second substrate for providing off-panel connections.

4. The touch sensor panel of claim 3, further comprising means for connecting the first plurality of electrodes on the first substantially transparent substrate to the second substantially transparent substrate.

5. The touch sensor panel of claim 1, further comprising a third substantially transparent substrate disposed between the first substantially transparent substrate and the second substantially transparent substrate.

6. A substantially transparent mutual capacitance touch sensor panel, comprising:
   a first substantially transparent substrate having a first plurality of electrodes of a first substantially transparent conductive material formed thereon forming columns that terminate near first and second opposing edges of the first substrate and configured for carrying sensing signals; and
   a second substantially transparent substrate having a second plurality of electrodes the first substantially transparent conductive material formed thereon and configured for carrying driving signals, and the second substrate further having a plurality of traces of a second conductive material for providing off-panel connections at a first edge of the second substrate, wherein the first edge of the first substrate and the first edge of the second substrate are aligned;
   a plurality of vias filed or coated with a conductive material for connecting the first plurality of electrodes of the first substantially transparent substrate from the first edge of the first substrate to the plurality of traces on the second substantially transparent substrate providing off-panel connections at the first edge of the second substrate;
   the first substantially transparent substrate having a border region of the first substantially transparent conductive material formed adjacent edges thereof around the periphery of the first substantially transparent substrate to form a ground border region, the first plurality of electrodes insulated from the ground region;

wherein one or more mutual capacitance sensors are formed between the first and second plurality of electrodes at locations at which the first and second plurality of electrodes cross over each other, a mutual capacitance of each mutual capacitance sensor capable of being modified by an object in close proximity to the sensor.

* * * * *